United States Patent
Choi

(10) Patent No.: US 7,964,857 B2
(45) Date of Patent: Jun. 21, 2011

(54) PLASMA SOURCE OF DIRECTED BEAMS AND APPLICATION THEREOF TO MICROLITHOGRAPHY

(75) Inventor: Peter Choi, Orsay (FR)

(73) Assignee: NANO UV, Villebon sur Yvette (FR)

( * ) Notice: Subject to any disclaimer, the term of this patent is extended or adjusted under 35 U.S.C. 154(b) by 1084 days.

(21) Appl. No.: 10/576,105

(22) PCT Filed: Oct. 18, 2004

(86) PCT No.: PCT/FR2004/002656
§ 371 (c)(1),
(2), (4) Date: Apr. 30, 2007

(87) PCT Pub. No.: WO2005/038822
PCT Pub. Date: Apr. 28, 2005

(65) Prior Publication Data
US 2011/0068282 A1     Mar. 24, 2011

(30) Foreign Application Priority Data
Oct. 17, 2003 (FR) .................................. 03 12202

(51) Int. Cl.
*G01N 21/33* (2006.01)
*G21K 5/00* (2006.01)
*H05H 1/00* (2006.01)

(52) U.S. Cl. ............... 250/504 R; 250/365; 250/423 P; 250/493.1; 315/111.21; 378/119; 438/474; 438/513

(58) Field of Classification Search ............. 250/504 R, 250/365, 423 P, 493.1; 315/111.21; 378/119; 438/474, 513
See application file for complete search history.

(56) References Cited

U.S. PATENT DOCUMENTS
4,219,705 A    8/1980   Hill
(Continued)

FOREIGN PATENT DOCUMENTS
EP    0 528 542    2/1993
(Continued)

OTHER PUBLICATIONS

Borisov et al.: Relativistic and charge-displacement self-channeling of intense ultrashort laser pulses in plasmas, Physical Review A (Statistical Physics, Plasmas, Fluids, and Related Interdisciplinary topics), Apr. 1992, vol. 45, No. 8, pp. 5830-5845.

(Continued)

*Primary Examiner* — Nikita Wells
(74) *Attorney, Agent, or Firm* — Pauley Petersen & Erickson

(57) ABSTRACT

A method for generating radiation in a range of desired wavelengths in a direction of emission is provided. According to the method, initial radiation is produced by a radiation source, the wavelengths thereof including the desired range, and the initial radiation is filtered in such a way as to substantially eliminate the initial radiation beams having a wavelength outside the desired range. The inventive method is characterized in that the filtering is carried out by setting up a controlled distribution of the refractive index of the beams in a control region through which the initial radiation passes, in such a way as to selectively deviate the beams of the initial radiation according to the wavelength thereof and to recover the beams having desired wavelengths. The invention also relates to an associated device.

41 Claims, 2 Drawing Sheets

U.S. PATENT DOCUMENTS

| | | | |
|---|---|---|---|
| 5,812,631 | A | 9/1998 | Yan et al. |
| 7,555,102 | B1 * | 6/2009 | Renard-Le Galloudec et al. ............................ 378/143 |
| 2001/0055364 | A1 | 12/2001 | Kandaka et al. |
| 2002/0021782 | A1 | 2/2002 | McDonald |
| 2003/0058429 | A1 | 3/2003 | Schriever |
| 2006/0004306 | A1 * | 1/2006 | Altshuler et al. ................. 601/3 |
| 2010/0078578 | A1 * | 4/2010 | Schuermann et al. .... 250/504 R |
| 2010/0183984 | A1 * | 7/2010 | Choi ............................ 430/319 |

FOREIGN PATENT DOCUMENTS

| | | |
|---|---|---|
| JP | 2000-252097 | 9/2000 |

OTHER PUBLICATIONS

Bolton et al.: Propagation of intense, ultrashort laser pulses through preionized plasma slabs, Journal of The Optical Society of America, Feb. 1997, vol. 14, No. 2, pp. 437-443.

Tsuda et al.: Physical properties of dense plasma produced by XeCl excimer laser in high-pressure argon gases, Japanese Journal of Applied Physics, Part 1, vol. 38, No. 6A, Jun. 1999, pp. 3712-3715.

* cited by examiner

PLASMA SOURCE OF DIRECTED BEAMS AND APPLICATION THEREOF TO MICROLITHOGRAPHY

BACKGROUND OF THE INVENTION

1. Field of the Invention

This invention relates to the generation of radiation at a desired wavelength.

More precisely, this invention relates to a process for the generation in a given direction of radiation emissions in a desired range of wavelengths, where the process includes: producing initial radiation by a radiation source whose wavelengths includes the desired range; and filtering the initial radiation, to substantially eliminate the part of the initial radiation whose wavelength is outside the desired range.

The invention also relates to a radiation generating device that can be used to implement such a process, as well as a lithography device incorporating such a generation device.

2. Discussion of Related Art

Processes and devices similar to the type mentioned above are known.

One (non-limiting) example of implementation concerns the generation of radiation at a desired wavelength intended for an optical chain, for lithography applications on a photosensitive substrate. FIG. 1 diagrammatically illustrates an optical system 100, that includes the following in succession:

a generator 10 of radiation in a desired range of wavelengths;

a lens assembly 11 which receives the radiation coming from the generator 10 and processes it (e.g., by subjecting it to collimation and/or focusing of its beams);

a mask 12 which receives the processed radiation coming from the lens assembly 11, and selectively allows to pass only the beams arriving at the mask via a transmission pattern 120, with the remainder of the radiation being stopped by the mask; and a substrate 13 which receives the beams that have been transmitted by the mask, and whose surface exposed to the radiation bears a photo-resistant or photosensitive product.

The beams arriving at the substrate react with the product and thus form, on the surface of the substrate, a pattern that matches the transmission pattern of the mask.

The desired range of wavelengths of the generator 10 can in particular be located in the ultra-violet (UV) spectrum, or in the extreme UV (EUV) spectra.

Note that in this text, the term "EUV" is conventionally used to refer to both EUV beams and soft x-rays.

The EUV beams are associated with very short wavelengths (wavelengths less than 100 nm, and of the order of a few tens of nms for example, where an application corresponds to a wavelength of 13.5 nm). This is advantageous in particular for photolithography applications, since in a corresponding manner, the patterns drawn by the beams can be of very small dimensions. In particular, this allows the formation of a larger quantity of patterns on a substrate of the same size.

It is necessary however to associate radiation filtering resources with the radiation generator.

In certain embodiments, in particular for radiation generators whose wavelength is in the EUV range, the generator includes a radiation source of the plasma source type.

In addition to the desired radiation, such radiation sources also emit: radiation whose wavelengths do not correspond to the desired range; and/or solid debris resulting from the interaction between the plasma and solid parts of the chamber in which this plasma is located (target, walls of the chamber, etc.).

In order to isolate, in the radiation coming from the source of the generator, only the beams that are at a desired wavelength, it is therefore necessary to provide filtering resources downstream of the source (e.g., immediately downstream of the source, in order to avoid exposing the mask to debris which could damage it).

In a known manner, such filtering resources include a multi-layer mirror which selectively reflects the beams according to their wavelength. Such a multi-layer mirror thus functions as a band-pass filter. Such a multi-layer mirror does not pass on the undesirable debris which can be emitted by the source, so that the elements located downstream of the filtering resources are not exposed to such debris. Such a solution allows filtering out of the beams emitted by a radiation source that can produce such debris. However, one drawback associated with such a known configuration is that the debris emitted by the source can damage the mirror of the filtering resources.

It would be possible to envisage distancing the filtering resources from the source, so as to reduce the probability that debris will damage the mirror of these filtering resources.

In this case however, there would be a significant reduction in the radiation stream recovered by the filtering resources, thus adversely affecting the performance of the whole optical system.

It therefore appears that the known configurations for generating radiation at a desired wavelength are associated with drawbacks when the radiation source can generate debris.

In particular, this disadvantage concerns applications in which the desired wavelengths fall in the EUV area.

SUMMARY OF THE INVENTION

One object of the invention is to provide processes and devices that avoid these drawbacks.

In order to attain this objective, the invention proposes, according to one embodiment, a process for the generation, in a given emission direction, of radiation in a desired range of wavelengths, where the process includes:

producing beams of initial radiation by a radiation source, whose wavelengths include the desired range; and filtering of the initial radiation, so as to substantially eliminate the beams of the initial radiation whose wavelength is outside the desired range, wherein the filtering is achieved by introducing a controlled distribution of the refraction index of the beams in a control region that is traversed by the initial radiation, to selectively deflect the beams of the initial radiation according to their wavelength, and to recover the beams of a desired wavelength.

Preferred, though not limiting, aspects of such a process are:

the controlled distribution of the refraction index of the beams is obtained by controlling the density distribution of electrons in the control region;

the control region is located in a plasma;

the plasma containing the control region is itself contained in a chamber associated with the radiation source;

electron density control is effected to obtain an electron density which is greater at a distance from a median initial radiation emission line than it is on the median emission line of the initial radiation;

the median initial radiation emission line is a straight initial radiation line, and the initial radiation is produced by the radiation source with a generally axi-symmetrical distribution around the straight initial radiation line;

in order to obtain the electron density distribution, an input of energy is applied to the plasma along the median initial radiation emission line; and the energy input is effected by ionization of the plasma along the median initial radiation emission line.

In certain embodiments, in order to effect the ionization, the following operations are required:

establishment of an electrical voltage at the terminals of the chamber containing the plasma, the terminals being spaced in the general direction defined by the median initial radiation emission line;

application of an energy beam to the median initial radiation emission line;

in order to recover the beams of a desired wavelength, there is at least one window downstream of the control region, to selectively pass beams in the desired wavelength range;

each window is positioned on the median initial radiation emission line, with a curvilinear abscissa corresponding to the place of intersection of the beams in the desired wavelength range which were deflected with the median initial radiation emission line;

the desired range of wavelengths falls within the interval [0-100 nm]; and the desired range of wavelengths falls within the EUV spectrum.

According to a second aspect, the invention also proposes a device for the generation, in a given emission direction, of radiation in a desired range of wavelengths, where the device includes:

a source of initial radiation whose wavelengths include the desired range; and filtering resources of the initial radiation, to substantially eliminate the beams of the initial radiation whose wavelength is outside the desired range, wherein the filtering resources include the means to introduce a controlled distribution of the refraction index of the beams in a control region that is traversed by the initial radiation, to selectively deflect the beams of the initial radiation according to their wavelength, and to recover the beams of a desired wavelength.

Preferred, though not limiting, aspects of such a device are as follows:

the means to introduce a controlled distribution of the refraction index includes resources to control the electron density distribution in the control region;

the control region is located in a plasma;

the plasma containing the control region is itself contained in a chamber associated with the radiation source;

the resources to control the electron density distribution can achieve an electron density which is greater at a distance from a median initial radiation emission line than it is on the median initial radiation emission line;

the median initial radiation emission line is a straight initial radiation line, and the resources to control the electron density distribution can achieve an electron density that is generally axi-symmetrical around the straight initial radiation line;

the resources to control the electron density distribution include resources for injecting energy into the plasma along the median initial radiation emission line;

the resources for injecting energy include resources for ionization of the plasma along the median emission line of the initial radiation;

the resources for injecting energy include resources to:

establish an electrical voltage at the terminals of the chamber containing the plasma, with the terminals being spaced in the general direction defined by the median initial radiation emission line; and apply an energy beam to the median initial radiation emission line;

downstream of the control region, the device includes at least one window to selectively pass beams in the desired wavelength range;

each window is positioned on the median initial radiation emission line, with a curvilinear abscissa corresponding to the place of intersection of the beams in the desired wavelength range, which were deflected with the median initial radiation emission line;

the device includes an additional multi-layer filtration mirror in association with at least some windows;

the device includes a multiplicity of modules, which each include a source of initial radiation and associated filtering resources, as well as an optical resource that can be used to collect the radiation subjected to filtration, in order to redirect it outside of the device;

the optical resource is a multi-layer mirror which can finalize filtering of the radiation;

the desired range of wavelengths falls within the interval [0-100 nm]; and the desired range of wavelengths falls within the EUV spectrum.

The invention also concerns a lithography device that includes a generation device according to one of the above aspects.

Other aspects, objectives and advantages of the invention will appear more clearly on reading the following description of the invention, which is provided with reference to the appended drawings on which, apart from FIG. 1 has already been described above.

DESCRIPTION OF PREFERRED EMBODIMENTS

Figure 1:
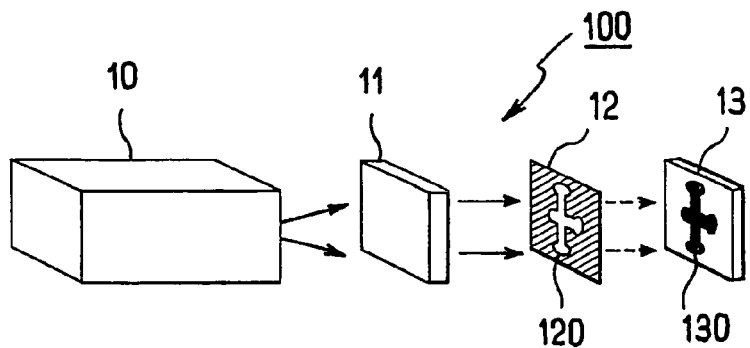
FIG. 1 is a schematic diagram illustrating an optical system.
Figure 2:
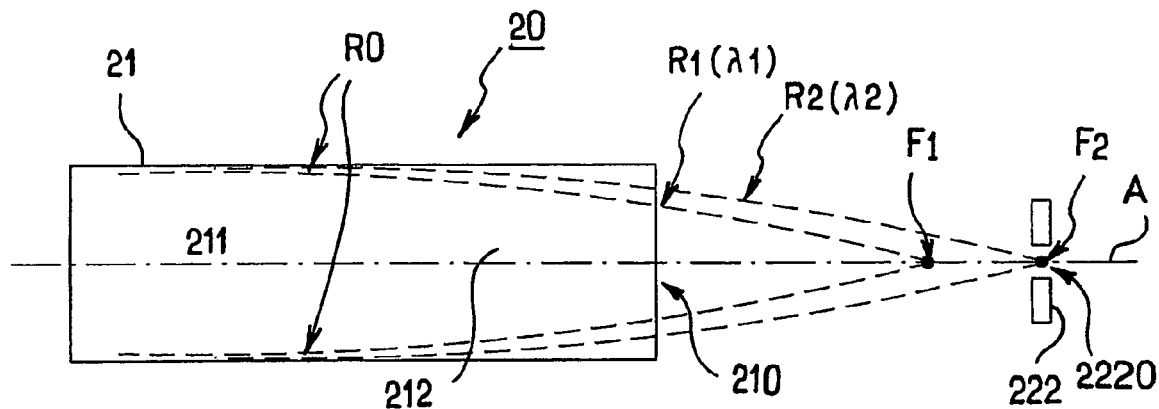
FIG. 2 is a schematic diagram of a radiation generator according to the invention.

FIG. 2 diagrammatically illustrates a radiation generator 20 according to the invention. This radiation generator includes a chamber 21 which is generally closed but with one side 210 open to let pass the beams emitted by the chamber.

The chamber 21 includes a source 211 that can produce an initial radiation R0. Typically this is a source containing a plasma.

The initial radiation includes beams whose wavelength corresponds to a desired range of wavelengths. In a preferred but not limiting embodiment of the invention, the desired range of wavelengths falls within the interval [0-100 nm]. This desired range of wavelengths can thus be located in the EUV spectrum. The chamber 21 can thus produce initial radiation in which a significant quantity of beams correspond to the desired wavelength range.

As mentioned previously, it is possible however that undesirable effects can be associated with the emission from the source: the initial radiation can also contain beams whose wavelengths do not correspond exactly to the desired range;

and it is also possible that the source 211 may emit a certain amount of debris with the initial radiation.

In order to prevent these undesirable effects, the generator 20 includes resources for filtering the initial radiation. These filtering resources can introduce a controlled distribution of the refraction index of the beams in a control region 212 traversed by the initial radiation, to selectively deflect the beams of the initial radiation according to their wavelength. The beams of a desired wavelength are then recovered (in particular using resources which will be described in this text).

Such embodiment makes use of a physical principle similar to that, for example, which causes the deflection of light beams in the presence of a gradient of the refraction index of the air (the particular case of air with high temperature gradients).

In the embodiment illustrated in FIG. 2, the control region is located inside of the chamber itself 21. Note that it is also possible for this control region to be located outside the chamber 21, downstream of the latter on the trajectory of the initial radiation.

Control of the distribution of the refraction index in the control region can be achieved by controlling the electron density distribution in the control region. In this regard, it is possible to exploit the relationship linking the refraction index $\eta$ to the electron density $n_e$:

$\eta = (1 - n_e/n_c)^{1/2}$, where n represents a critical electron density value beyond which the beams are no longer able to pass, since this value of $n_c$ is related to the wavelength of the beams concerned.

Returning to the method of implementation illustrated in FIG. 2, the control region 212 is therefore located in the chamber 21, and this control region is thus in the plasma associated with the source 211.

Control of the electron density distribution in the control region allows one to influence the trajectories of the different beams of the initial radiation, according to the wavelength of these beams. This is illustrated in FIG. 2, which shows two general trajectories of two types of beam: beams of a first wavelength $\lambda 1$, these beams have the trajectory R1; and beams of a second wavelength $\lambda 2$, which is shorter than the first wavelength $\lambda 1$, these beams have the trajectory R2.

In a preferred embodiment of the invention which is illustrated here, an electron density distribution is established in the control region such that the electron density is greater at a distance from a median initial radiation emission line than it is on the median initial radiation emission line.

The "median initial radiation emission line" corresponds, in the embodiment shown in FIG. 2, to the straight line A. Note that in the embodiment illustrated here, the chamber is typically in the shape of a round cylinder, and that the initial radiation is emitted with a generally axi-symmetrical distribution of the beams, around line A.

Figure 3:
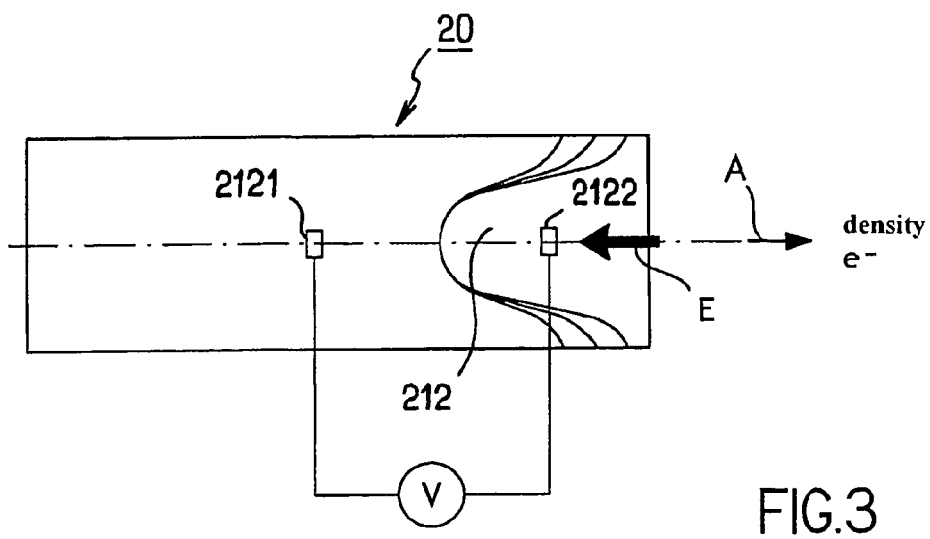
FIG. 3 is a similar representation, illustrating an electron density distribution which is controlled in a particular manner in the context of the invention.

The configuration of the electron density distribution desired in this embodiment is illustrated diagrammatically in FIG. 3, which shows electron density curves.

In this figure, it can be seen that the electron density value is greater at the edges of the chamber (distanced from line A) than in the middle of this chamber (close to line A). It can also be seen that the three electron density curves that are shown diverge in the peripheral region of the chamber. Such an electron density distribution is opposite to the electron density distribution that can normally be observed in the chamber of a radiation source. In the case of a chamber of known type, one generally observes a higher density at the center of the chamber.

The density configuration shown in FIG. 3 is therefore specific, and it is created by design for the embodiment of the invention described here. In order to create such an electron density distribution in the control region, energy is injected into the plasma of the chamber 21 along the line A. This input of energy can be effected, for example, by a beam of electrons or by a laser beam, directed into the control region along the axis defined by line A. This input of energy is illustrated diagrammatically by arrow E. It is used to ionize the plasma in the control region, along line A.

Prior to this input of energy, it was possible to establish an electric voltage at the terminals of the chamber containing the plasma, the terminals being spaced along the general direction defined by the median initial radiation emission line.

FIG. 3 diagrammatically represents such terminals 2121 and 2122. It is thus possible to create an electron density distribution of the type shown in FIG. 3. Note that such a distribution can be obtained by starting from a density distribution of a known type, in which the density is higher at the center of the chamber.

The input of energy and the ionization associated with it is used in this embodiment to "invert" the density configuration, and to obtain a higher density close to the peripheral walls of the chamber.

FIG. 3 shows three density distribution curves as mentioned. These three curves are generally coincident in the central region of the chamber (close to line A), but have different values of density close to the walls of the chamber. These three curves correspond to successive states of the electron density distribution, when ionization of the central zone of the control region has been effected.

At the end of such an ionization, there can be an electron density which is already higher at the periphery of the control region.

If, however, one then allows the plasma thus ionized to develop, this configuration will then become accentuated, and the value of the density will again increase at the periphery. In fact the high-density electrons present in great quantity at the periphery of the chamber will have a tendency to cause the internal walls of this chamber to melt, single layer of wall coating by single layer of wall coating.

This melting leads to an additional input of electrons at the periphery of the chamber, which still further increases the electron density in this area.

FIG. 2 specifically represents a window 222 which is positioned at the focal point of the beams on the trajectory R2. This window corresponds to a resource for recovery of beams of a desired wavelength, from amongst the beams of the initial radiation.

It has been seen that the different beams emitted by the initial radiation R0 were deflected in a different manner, by the electron density distribution which existed in the control region, according to their wavelength. This selective deflection causes the beams associated with a given wavelength to converge toward a specific point on line A, referred to herein as the "focal point".

The position of the focal point on line A (a position that can be defined by a curvilinear abscissa of a marker linked to the line A) therefore depends on the wavelength associated with this focal point.

FIG. 2 shows focal points F1 and F2 associated respectively with the beams of trajectories R1 and R2.

The window 222 is thus positioned at focal point F2. The function of this window is to allow to pass only the beams arriving at line A generally at focal point F2 (that is the beams of wavelength $\lambda 2$). To this end, window 222 includes an opening 2220 which is preferably centered on line A.

This window thus forms an advantageous resource for recovering only the beams of a desired wavelength. It thus improves filtration of the beams emitted by the initial radiation.

In this way, it is possible to have windows in any desired position on line A, according to the wavelength that one wished to isolate.

It can therefore be seen that the invention allows beams of a desired wavelength (or at desired wavelengths, to be exact) to be isolated in an efficient manner.

With respect to the invention, there is no exposing of a filtration resource, such as a multi-layer mirror, to debris that can damage it.

With respect to the invention, the fact that the desired beams are recovered at a specific point toward which they were deflected already allows a large part of any debris emitted by the source 21 to be avoided.

Implementation of recovery resources such as a window allows the quantity of debris to be reduced still further. The result is that at the end of this filtration, there is very little or no debris.

Note that downstream of the focal point of the beams that need to be recovered, it is possible to create resources for optical conditioning of the beam formed by these filtered beams.

In particular, this optical conditioning can be a collimation and/or a focusing process.

The recovered beam can therefore be sent directly toward a lithography mask.

It is also possible to direct the recovered beam toward additional filtering resources, if so desired. Such additional filtering resources can include a multi-layer mirror like those which constitute the filtering resources that are known currently.

The layers of such a multi-layer mirror are designed (in composition and thickness) so that the mirror selectively reflects only the beams of a given wavelength (according to a condition known as the Bragg condition, which links the reflectivity of the mirror to the wavelength of the incident beams).

In this variant, several filtering resources are used in series. The resource that is furthest upstream, which performs a selective deflection of beams and their recovery, provides protection for the resource furthest downstream (the multi-layer mirror) from the debris emitted by the source.

Note finally that it is possible to implement the invention in a device that includes a multiplicity of sources of initial radiation, each associated with resources that can be used to control a distribution of the refraction index in an associated control region.

Figure 4:
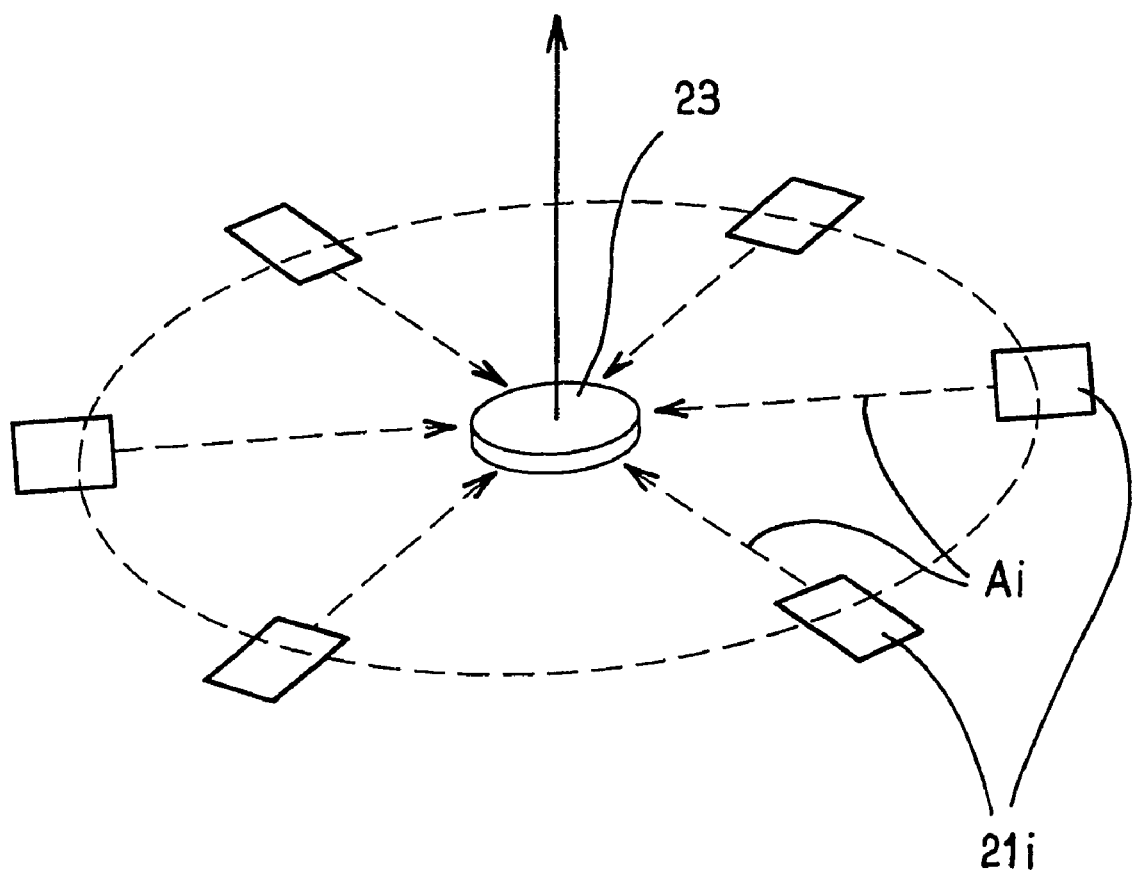
FIG. 4 illustrates a particular method of implementation of the invention with a multiplicity of radiation sources.

This mode of implementation is illustrated diagrammatically in FIG. 4.

In this figure, a multiplicity of chambers 21i which are similar to the chamber 21 already described, direct their respective radiation along respective median lines Ai, which converge toward a central optic 23. The central optic can thus receive the beams emitted by one or more chambers 21i, according to the chambers that are active.

The distance between the optic 23 and each chamber is adjusted to select the radiation filtering wavelength associated with each active chamber. It is also thus possible to cause beams of different wavelengths, coming from different chambers, to arrive at the optic 23. The optic 23 is able to redirect the received beams toward the exterior, and therefore toward other optical processing resources (such as a lithography mask) for example.

The invention claimed is:

1. A process using an optical device for generating, in a given direction of emission, radiation in a desired range of wavelengths, said process comprising:
   producing beams of initial radiation by a radiation source whose wavelengths include the desired range,
   filtering the beams of initial radiation to substantially eliminate the beams of initial radiation whose wavelength is outside the desired range,
   wherein said filtering is effected by introducing a controlled distribution of the refraction index of the beams in a control region that is traversed by the initial radiation to selectively deflect the beams of the initial radiation according to their wavelength, and to recover the beams of a desired wavelength; wherein the controlled distribution of the refraction index of the beams is obtained by controlling electron density distribution in the control region; and wherein the control region is located in a plasma.

2. A process according to claim 1 wherein the plasma containing the control region is itself contained in a chamber associated with the radiation source.

3. A process according to claim 2 wherein electron density control is effected to obtain an electron density which is greater at a distance from a median initial radiation emission line than it is on the median initial radiation emission line.

4. A process according to claim 3 wherein the median initial radiation emission line is a straight initial radiation line, and the initial radiation is produced by the radiation source with a generally axi-symmetrical distribution around the straight initial radiation line.

5. A process according to claim 4 wherein to obtain the electron density distribution, an input of energy is applied to the plasma along the median emission line of the initial radiation.

6. A process according to claim 5 wherein the input of energy is effected by ionization of the plasma along the median emission line of the initial radiation.

7. A process according to claim 6 wherein effecting the ionization, comprises
   establishing an electric voltage at the terminals of the chamber containing the plasma, the terminals being spaced according to the direction generally defined by the median emission line of the initial radiation, and
   applying an energy beam to the said median initial radiation emission line.

8. A process according to claim 1 wherein electron density control is effected to obtain an electron density which is greater at a distance from a median initial radiation emission line than it is on the median initial radiation emission line.

9. A process according to claim 8 wherein the median initial radiation emission line is a straight initial radiation line, and the initial radiation is produced by the radiation source with a generally axi-symmetrical distribution around the straight initial radiation line.

10. A process according to claim 9 wherein to obtain the electron density distribution, an input of energy is applied to the plasma along the median emission line of the initial radiation.

11. A process according to claim 10 wherein the input of energy is effected by ionization of the plasma along the median emission line of the initial radiation.

12. A process according to claim 1 wherein, in order to recover the beams of a desired wavelength, there is at least one window downstream of the control region to selectively pass beams in the desired wavelength range.

13. A process according to claim 12 wherein each window is positioned on the median initial radiation emission line, with a curvilinear abscissa corresponding to the place of intersection of the beams in the desired wavelength range which were deflected with the median initial radiation emission line.

14. A process according to claim 13 wherein the desired range of wavelengths falls within the interval [0-100 nm].

15. A process according to claim 14 wherein the desired range of wavelengths falls within the EUV spectrum.

16. A process according to claim 1 wherein the desired range of wavelengths falls within the interval [0-100 nm].

17. A process according to claim 16 wherein the desired range of wavelengths falls within the EUV spectrum.

18. A optical device for the generation of radiation in a desired range of wavelengths, in a given direction of emission, where the device comprises:
a source of initial radiation whose wavelengths include the desired range,
filtering resources of the said initial radiation, to substantially eliminate the beams of initial radiation whose wavelength is outside the said desired range,
wherein said filtering resources include means to introduce a controlled distribution of the refraction index of the beams in a control region that is traversed by the initial radiation, to selectively deflect the beams of the initial radiation according to their wavelength, and to recover the beams of a desired wavelength; wherein said means to introduce a controlled distribution of the refraction index comprises resources to control the electron density distribution in the control region; and wherein the control region is located in a plasma.

19. A device according to claim 18 wherein said plasma containing the control region is itself contained in a chamber associated with said radiation source.

20. A device according to claim 19 wherein said resources to control the electron density distribution can achieve an electron density which is greater at a distance from a median initial radiation emission line than it is on the median initial radiation emission line.

21. A device according to claim 20 wherein the median initial radiation emission line is a straight initial radiation line, and said resources to control the electron density distribution can achieve an electron density that is generally axisymmetrical around the said straight initial radiation line.

22. A device according to claim 21 wherein said resources to control the electron density distribution include resources for injecting energy into said plasma along the median initial radiation emission line.

23. A device according to claim 22 wherein said resources for injecting energy includes resources for ionization of the plasma along the median initial radiation emission line.

24. A device according to claim 23 wherein said resources for injecting energy comprise resources to:
establish an electric voltage at the terminals of the chamber containing the plasma, the terminals being spaced in the general direction defined by the median initial radiation emission line, and
apply an energy beam to the median initial radiation emission line.

25. A device according to claim 18 wherein said resources to control the electron density distribution can achieve an electron density which is greater at a distance from a median initial radiation emission line than it is on the median initial radiation emission line.

26. A device according to claim 25 wherein the median initial radiation emission line is a straight initial radiation line, and said resources to control the electron density distribution can achieve an electron density that is generally axisymmetrical around the straight initial radiation line.

27. A device according to claim 26 wherein said resources to control the electron density distribution include resources for injecting energy into said plasma along the median initial radiation emission line.

28. A device according to claim 27 wherein said resources for injecting energy includes resources for ionization of the plasma along the median initial radiation emission line.

29. A device according to claim 28 wherein said resources for injecting energy comprise resources to:
establish an electric voltage at the terminals of the chamber containing the plasma, the terminals being spaced in the general direction defined by the median initial radiation emission line, and
apply an energy beam to the median initial radiation emission line.

30. A device according to claim 18 comprising, downstream of the said control region, at least one window to selectively pass beams in the desired wavelength range.

31. A device according to claim 30 wherein each window is positioned on the median initial radiation emission line, with a curvilinear abscissa corresponding to a place of intersection of the beams in the desired wavelength range which were deflected with the median initial radiation emission line.

32. A device according to claim 31 wherein the device includes an additional multi-layer filtration mirror in association with at least some windows.

33. A device according to claim 32 comprising a multiplicity of modules which each include a source of initial radiation and associated filtering resources, and an optical resource useable to collect the radiation subjected to filtration, in order to re-direct it outside of the device.

34. A device according to claim 33 wherein said optical resource is a multi-layer mirror which can finalize filtration of the radiation.

35. A device according to claim 30 wherein the device includes an additional multi-layer filtration mirror in association with at least some windows.

36. A device according to claim 35 comprising a multiplicity of modules which each include a source of initial radiation and associated filtering resources, and an optical resource useable to collect the radiation subjected to filtration, in order to re-direct it outside of the device.

37. A device according to claim 36 wherein said optical resource is a multi-layer mirror which can finalize filtration of the radiation.

38. A device according to claim 18 wherein the said desired range of wavelengths falls within the interval [0-100 nm].

39. A device according to claim 38 wherein the desired range of wavelengths falls within the EUV spectrum.

40. A lithography device that includes a generation device according to claim 39.

41. A lithography device that includes a generation device according to claim 18.

* * * * *